(12) United States Patent
Brada et al.

(10) Patent No.: US 7,549,878 B2
(45) Date of Patent: Jun. 23, 2009

(54) RETENTION OF REPLACEABLE SUBASSEMBLIES, WITH AUTOMATIC FORCED DISCONNECTION

(75) Inventors: Ralf Brada, Kölleda (DE); Michael Bräunlich, Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 929 days.

(21) Appl. No.: 11/096,384

(22) Filed: Mar. 31, 2005

(65) Prior Publication Data

US 2005/0221685 A1 Oct. 6, 2005

(30) Foreign Application Priority Data

Apr. 2, 2004 (EP) .................................. 04008070

(51) Int. Cl.
*H01R 29/00* (2006.01)
(52) U.S. Cl. ........................ 439/188; 439/180; 439/716; 439/94; 439/532; 439/181
(58) Field of Classification Search ................. 439/180, 439/181, 188, 94, 532, 716
See application file for complete search history.

(56) References Cited

U.S. PATENT DOCUMENTS

| 4,268,108 | A | * | 5/1981 | Debaigt ...................... 439/716 |
| 4,919,627 | A | * | 4/1990 | Cable .......................... 439/263 |
| 6,215,204 | B1 | | 4/2001 | Brown et al. |
| 2002/0182902 | A1 | | 12/2002 | Lostoski et al. |

FOREIGN PATENT DOCUMENTS

| DE | 31 47 056 A1 | 6/1983 |
| DE | 198 07 710 A1 | 9/1999 |
| EP | 0 599 551 A1 | 6/1994 |
| EP | 1524889 | 4/2005 |

* cited by examiner

Primary Examiner—Tho D Ta

(57) ABSTRACT

Retention of replaceable subassemblies, with automatic forced disconnection. The invention relates to a terminal module 1 for locking a subassembly or a PS module 2 on the terminal module in a way that satisfies safety requirements. The subassembly 2 is hinged onto the terminal module 1. The terminal module 1 has a sliding catch 3 for fixing the subassembly 2 on the terminal module 1. Disconnection of electrical contacts is guaranteed during the hinging-on.

13 Claims, 10 Drawing Sheets

FIG 1
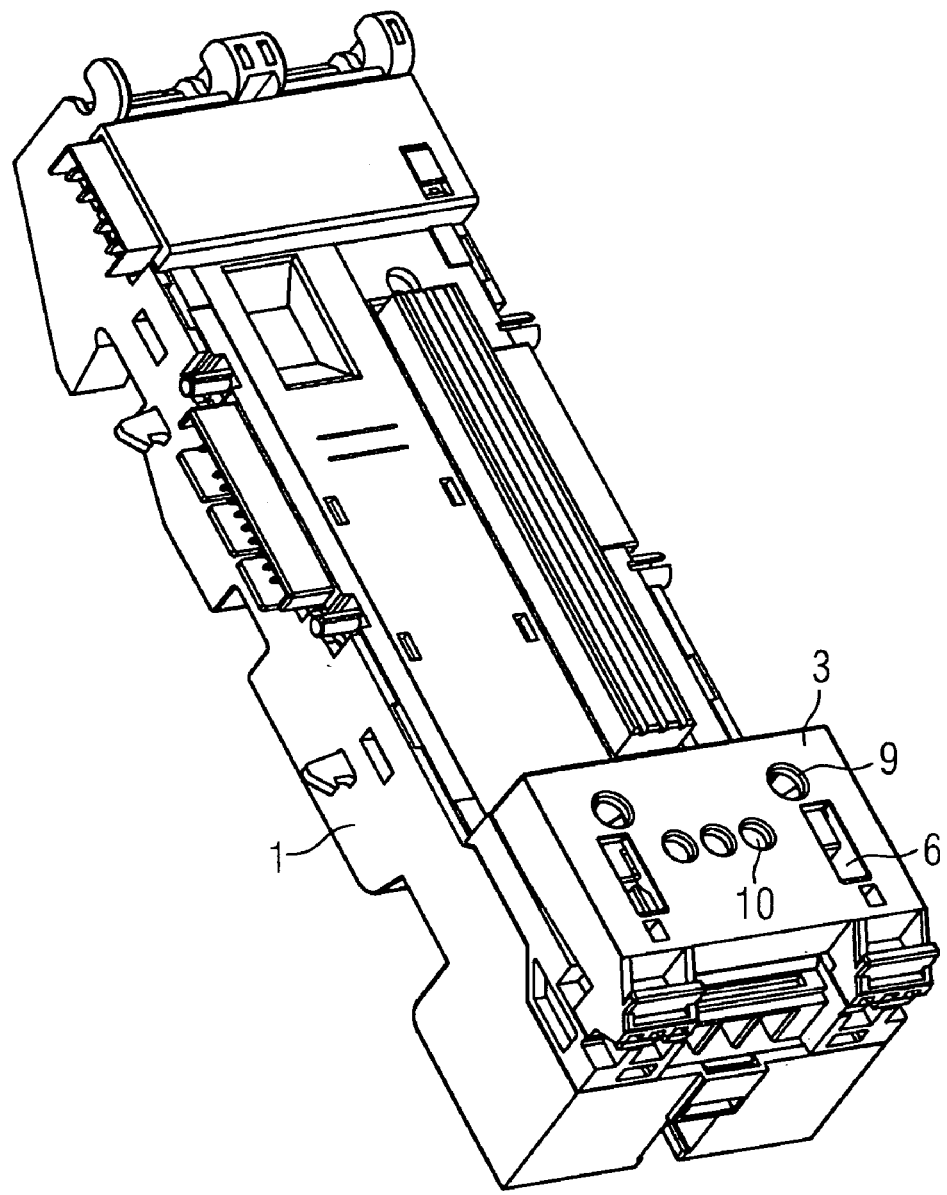
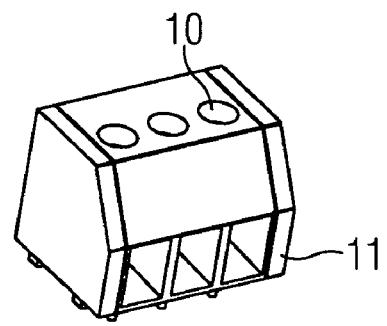

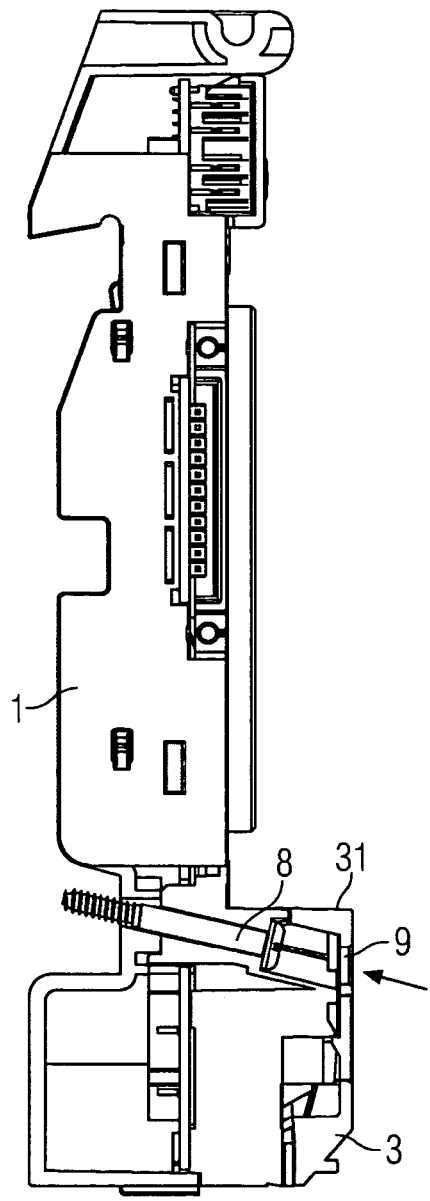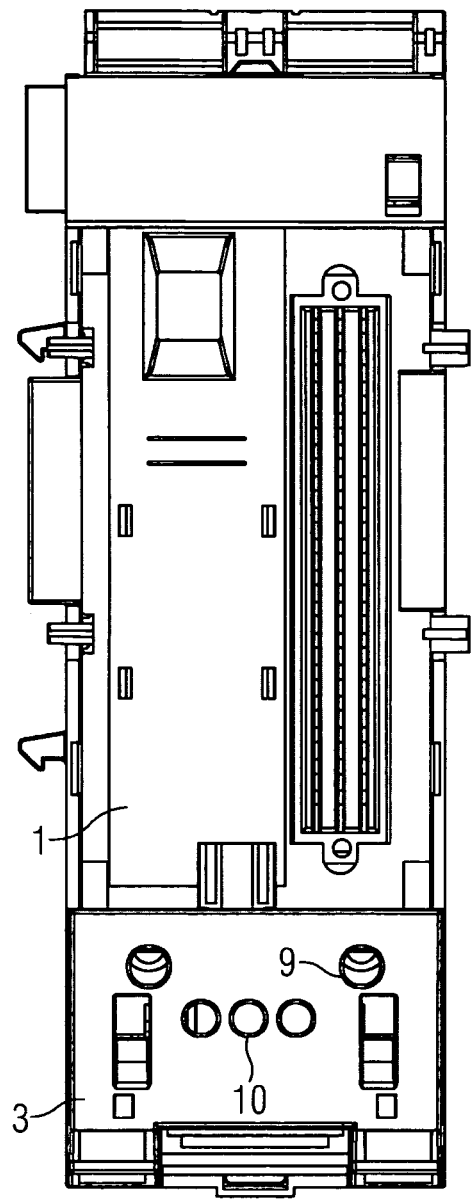

FIG 8
FIG 9
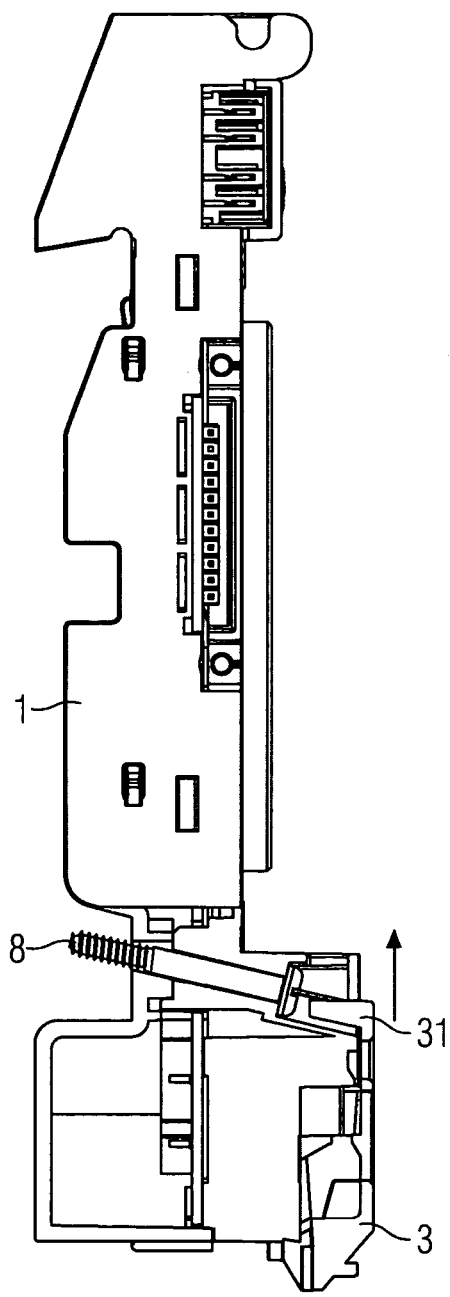
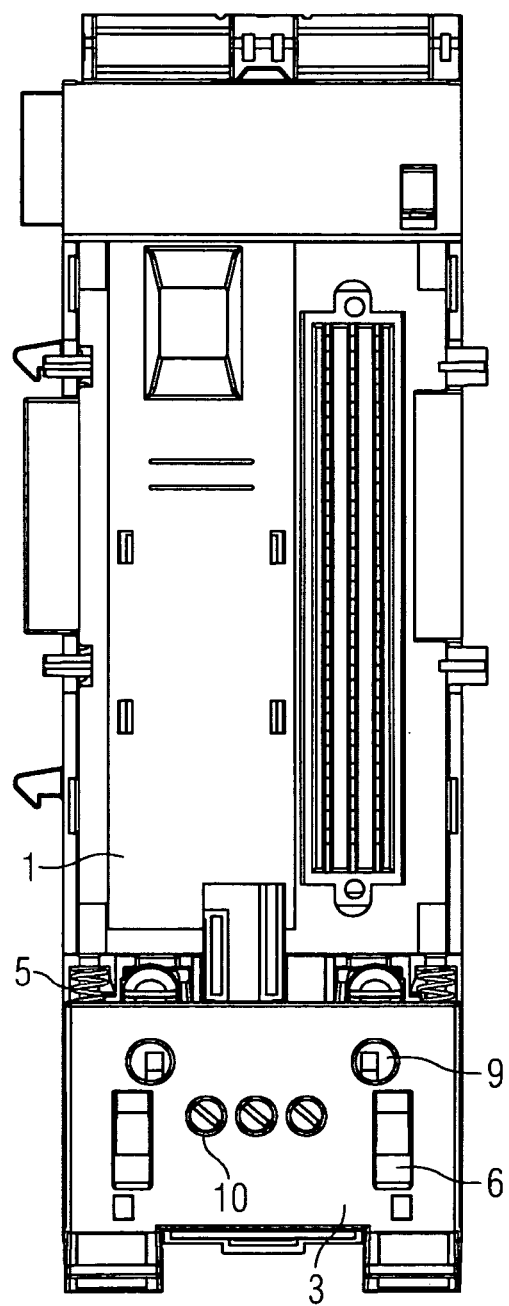

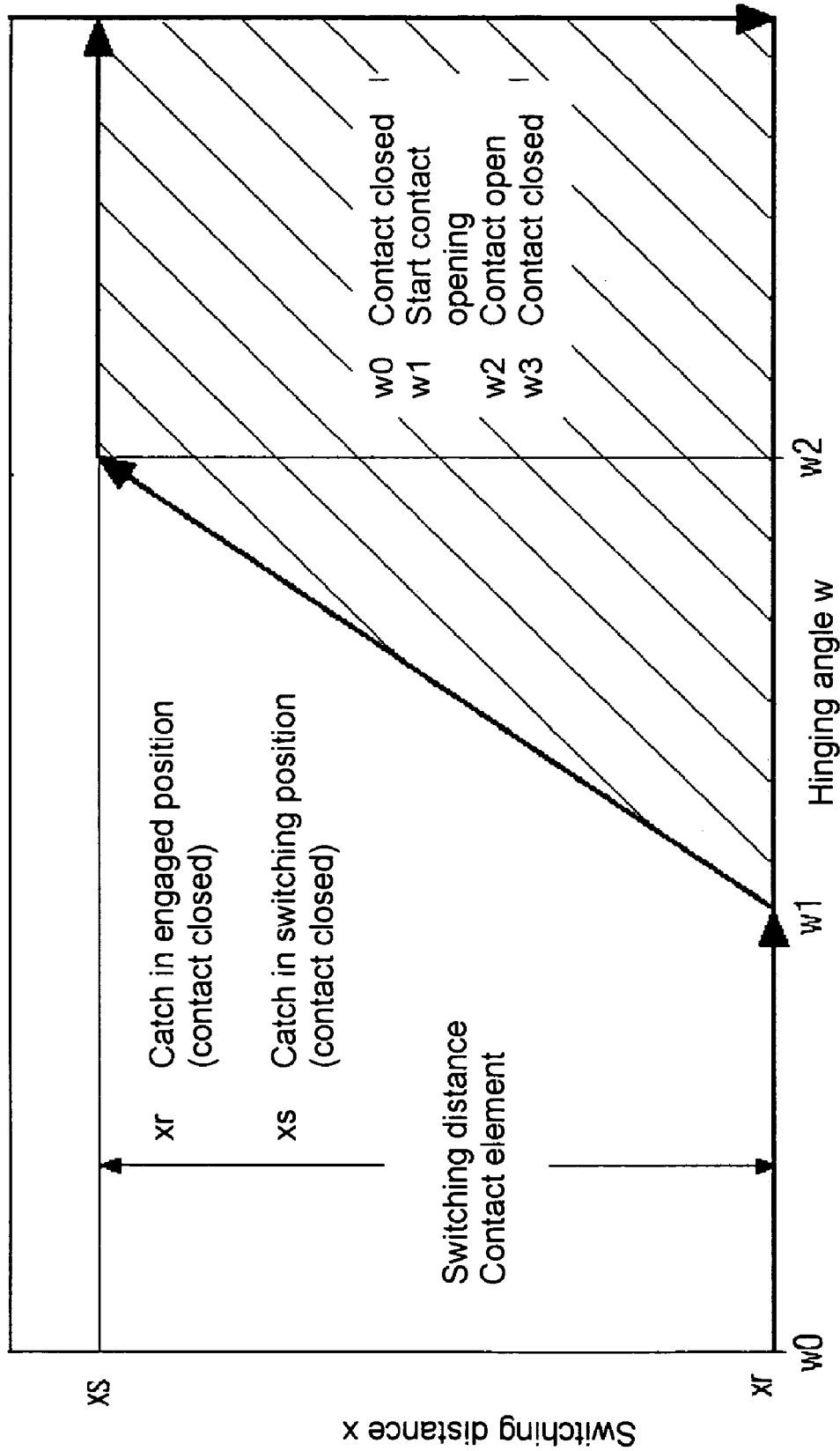

RETENTION OF REPLACEABLE SUBASSEMBLIES, WITH AUTOMATIC FORCED DISCONNECTION

CROSS REFERENCE TO RELATED APPLICATIONS

This application claims priority to the European application No. 04008070.7, filed Apr. 2, 2004 and which is incorporated by reference herein in its entirety.

FIELD OF INVENTION

The invention relates to a terminal module for accommodating at least one subassembly, in particular a power supply module.

BACKGROUND OF INVENTION

Electrical apparatus, devices and equipment are often designed to be modular, redundant and interchangeable so that they are more adaptable to the requirements of the user. If the modular device is an electrical control system then a practical modularity is usually achieved by splitting into passive (interference-resistant) terminal modules and active (and hence interference-prone) subassemblies or electronic modules. The control system function required by the customer is ultimately achieved by linking together a number of terminal modules and electronic modules.

Similarly, the power supply components for the electronic control system are designed to be modular, redundant and interchangeable.

In order to guarantee continuous operation, it must also be possible to replace and fit the interference-prone subassemblies or electronic modules, and the power supply modules (PS modules), under load. The apparatus or parts of the apparatus are therefore not switched off before changing the subassemblies or electronic modules or PS modules (all classed below as a subassembly). If, however, a subassembly is connected, for example, to a terminal module via a circuit in such a way that when plugging in or pulling out the electrical subassembly, sparking at the connector between the electrical subassembly and the terminal module cannot be ruled out, then special design measures need to be provided that prevent such sparking.

One option is to design the locking of the subassembly on the terminal module in such a way that internal disconnection of the subassembly is forced to occur when the locking mechanism is operated. This design must also guarantee that enough time elapses between the internal electrical disconnection and the release of the subassembly for any energy still stored in capacitances or inductances to have decayed away safely. This mechanism must work in reverse when plugging in the electrical subassembly, i.e. the internal connection of the subassembly must not be possible until the plugging-in process is complete.

The older European application with application number 03023213.6 proposes a locking mechanism which satisfies safety requirements for locking subassemblies by means of a catch, in which the electrical contact is forced to open during the plugging-in and pulling-out. The locking mechanism and the necessary disconnection during pulling-out and plugging-in takes place in the subassembly in this solution.

Such a solution cannot be implemented if the subassembly has special design characteristics that make it impossible to integrate in the subassembly the implementation of the catch mechanism and the forced disconnection, for instance the fact that the subassembly is encapsulated or potted.

SUMMARY OF THE INVENTION

The object of the present invention is to define a retention mechanism (e.g. an arresting or locking mechanism) for subassemblies in which the locking and the electronic forced disconnection are performed outside the subassembly.

The object is achieved by a terminal module for accommodating at least one subassembly, in particular a power supply module, having a sliding catch (e.g. a latch or a bolt) for mechanical retention, locking or arresting of the subassembly in the operating state, where the catch can move linearly against a force produced by a thrust piece (e.g. an abutment, a thrust bearing, a bearing, or a counter bearing) when pulling out and/or plugging in the subassembly, and having electrical contacts for the subassembly, where the electrical contacts are connected to the catch in such a way that the electrical contacts are opened when pulling out and/or plugging in the subassembly.

The invention is based on the knowledge that it should be guaranteed to be as easy as possible to plug in and pull out, or hinge on and hinge off, a subassembly on a terminal module. A positive-fit connection between subassembly and terminal module should also be guaranteed in this case, to ensure that the subassembly is fastened securely. At the same time it should be possible to remove the subassembly relatively simply and quickly.

At the same time it is guaranteed that, while pulling out and plugging in the subassembly or the PS module, which is to take place without disconnecting the supply voltage, no arcing or sparking occurs across the current carrying pins of a connector forming the electrical connection between subassembly or PS module and terminal module.

These requirements are advantageously achieved in the present invention in that a sliding catch, which is driven via a switching cam, is mounted on the terminal module and guarantees the mechanical retention of the subassembly or the PS module in the operating state. The catch is also connected to the electrical contacts for the subassembly or the PS module in such a way that the movement of the catch during the process of hinging-on or hinging-off automatically results in disconnection of the electrical contacts. This breaks one or more non-sparking intermediate circuits in the subassembly or the PS module, which in turn safely break the potentially sparking main circuits.

In this arrangement the catch is moved against a thrust piece, for example one or more compression springs, during pulling out and plugging in.

A further advantageous embodiment of the invention is characterized in that a thrust piece, in particular a compression spring, is provided, the catch being able to move against a force produced by the thrust piece. The thrust piece ensures that, when no subassembly or PS module is hinged in place, the catch sits in a defined position in which certain elements, for example screws for a terminal, are exposed for use.

In addition, the compression spring for exerting a force on the catch is provided in such a way that the necessary retention forces are generated for a force-fit and positive-fit connection of the subassembly or the PS module to the terminal module. In addition, the compression spring or the thrust piece ensures that the catch is in a defined position throughout the entire hinging-on process.

A further advantageous embodiment of the invention is characterized in that the catch has at least one first opening for receiving a hooked catch of a subassembly, the opening being implemented in such a way that the extraction or insertion of the hooked catch when pulling out and/or plugging in the subassembly produces the movement of the catch. Thus the disconnection and connection of the electrical contacts, and the engaging of the hinged-on module, is implemented via a cam.

A lateral movement of the subassembly is achieved by positive-fit geometries.

A further advantageous embodiment of the invention is characterized in that fixing means are provided for fixing the terminal module on a mounting rail, the fixing means being arranged in such a way that the catch can only be moved in the fixed state. Thus it is not possible to move the catch until the terminal module is fixed on the mounting rail. This ensures protection from incorrect mounting. Said fixing means are embodied as screws for example.

The catch advantageously has second openings for operating the fixing means. The catch then cannot be moved until the screws, for example, are tightened firmly. For this purpose, the catch is shaped to prevent it sliding over the untightened screws. If the catch cannot be moved, then it is also impossible to hinge on or plug in a subassembly. Thus the whole structure ensures correct operation.

A further advantageous embodiment of the invention is characterized in that the catch has third openings, the third openings only being accessible in the fixed state, when the catch can be moved, and the third openings being provided for operating an electrical terminal. In the operating state, the plugged-in subassembly is provided to cover the third openings. Thus any manipulation on the terminals cannot be performed in the operating state.

A manipulation on these terminals would result in sparking. It is stipulated in law that the terminals must be covered. This cover must contain a visible safety notice of the form: "Caution! Do not open when live!". This notice is also printed on the catch. Since the catch needs to be moved first in order to access the terminals, the requirement is met. In addition, nothing can be performed directly on the terminals in the wiring/commissioning phase preceding the operating state, nor with the power supply pulled out (e.g. when replacing a faulty power supply module).

The invention is described and explained in more detail below with reference to the exemplary embodiments shown in the figures.

BRIEF DESCRIPTION OF THE DRAWINGS

FIG. 1 shows a terminal module with sliding catch,

FIG. 6 shows an exemplary embodiment of the fixing means of the terminal module, FIG. 7 shows an exemplary embodiment of the openings in the catch for accessing the fixing means, FIG. 8 shows a side view of fixed terminal module, FIG. 9 shows a plan view of fixed terminal module, FIG. 12 shows a switching diagram representing the switching distance and the switching position.

DETAILED DESCRIPTION OF THE INVENTION

Figure 2:
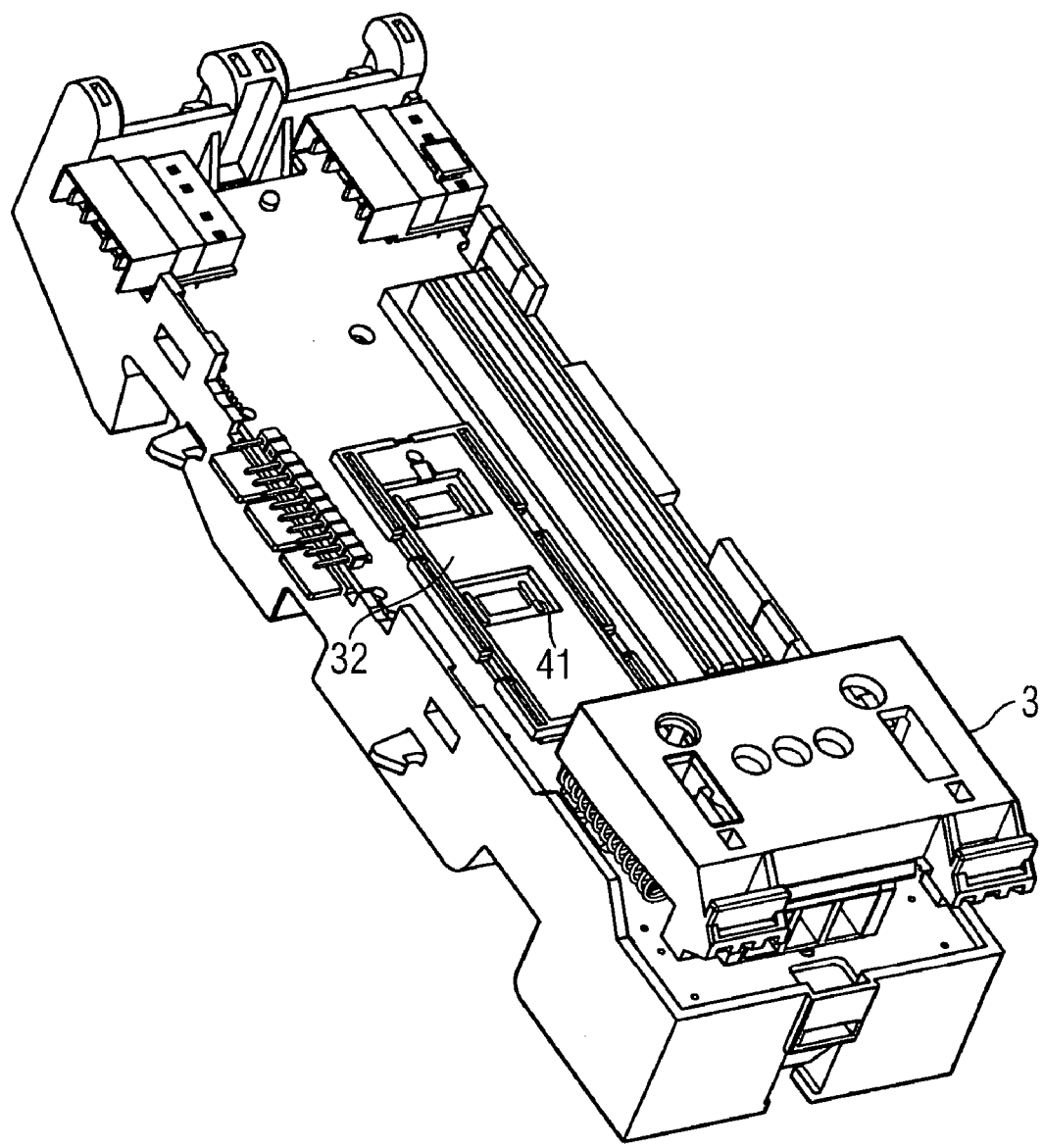
FIG. 2 shows a terminal module without cover with catch.

FIG. 1 shows a terminal module 1 having a sliding catch 3. The catch 3 has a first opening 6 for receiving a hooked catch 7 of a subassembly 2 or a power supply module (PS module). In addition, the catch 3 has second openings 9 for operating fixing means 8, for example a screw. There can be one or more of such openings 9, so that a different number of fixing means 8 can be used. The fixing means 8 are used for fixing the terminal module 1 on a mounting rail. In addition, the catch 3 has third openings 10 for operating a terminal 11. Breaking contacts 4 are rigidly connected to the catch 3.

Movement of the catch 3 simultaneously causes movement of the breaking contacts 4. The electrical contacts 4 are forced to open when pulling out or plugging in, or when hinging on or hinging off, a subassembly 2 or a power supply module 2. Retention of the power supply PS in the operating state is simultaneously guaranteed.

FIG 2 shows a perspective view from above of a terminal module 1 having catch 3. The top cover or the upper section of the terminal module is not shown in this diagram, so that the switching slide 32, which connects the contacts 4 to the catch 3, and which lies under the upper section, can be seen. Fixed on the switching slide 32 are contact springs 41 which open and close the electrical contacts 4.

Figure 3:
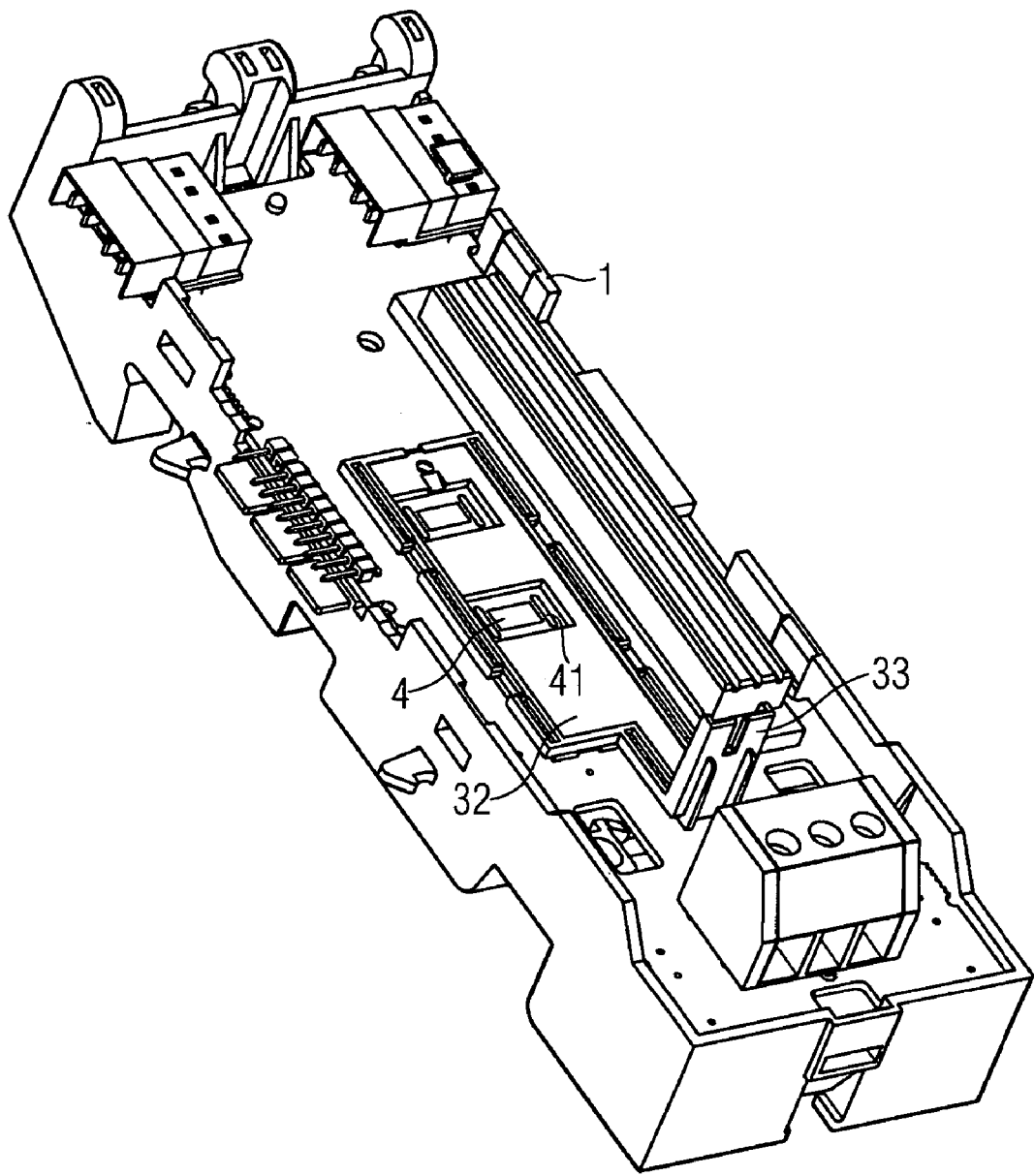
FIG. 3 shows a terminal module without cover and without catch.

FIG 3 shows the same view as FIG. 2, now also without the catch 3 in FIG. 1. The switching slide 32 has a section 33 that is bent upward and grips under the catch 3 and is connected to it.

Figure 4:
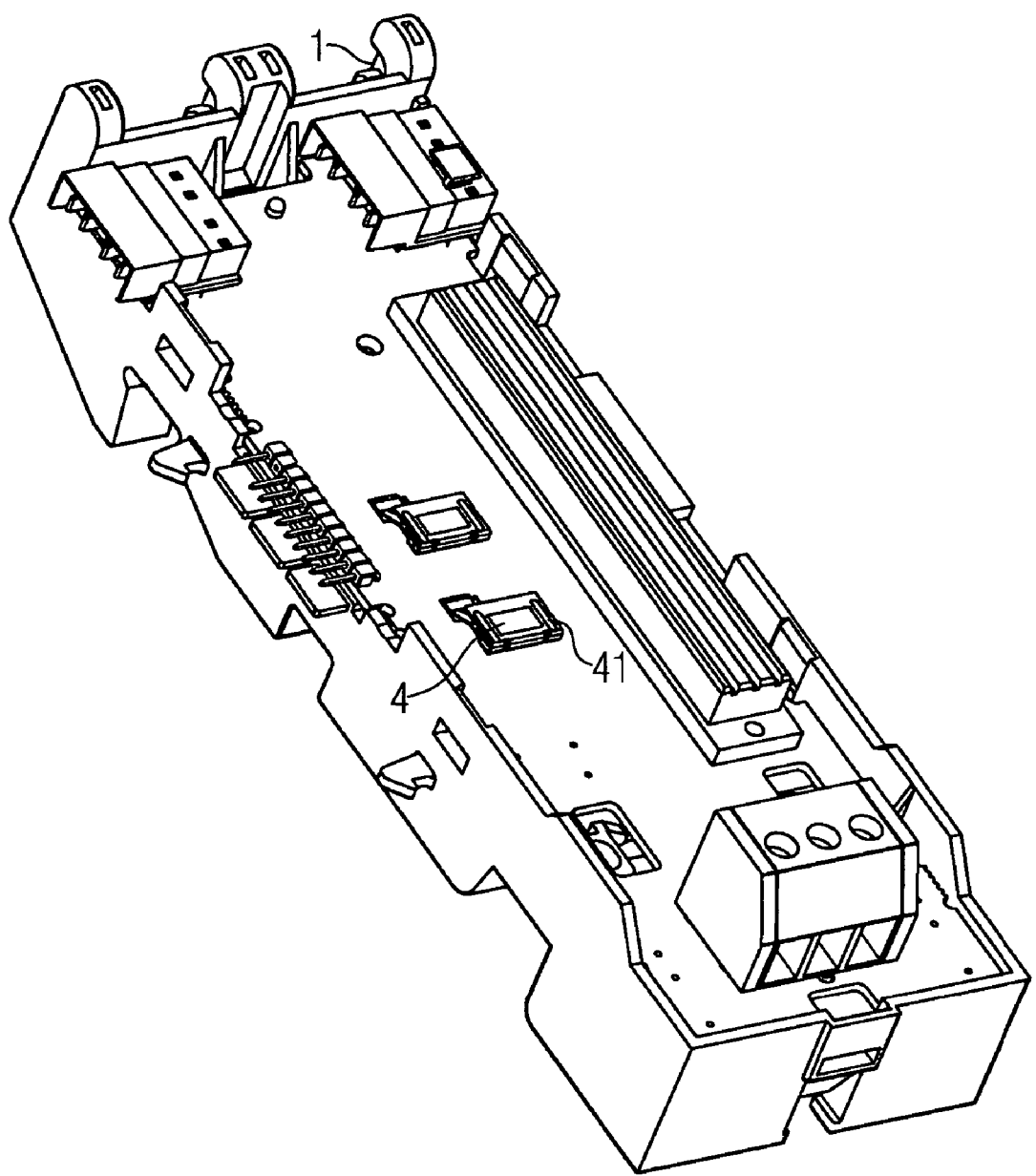
FIG. 4 shows a terminal module with closed contacts.
Figure 5:
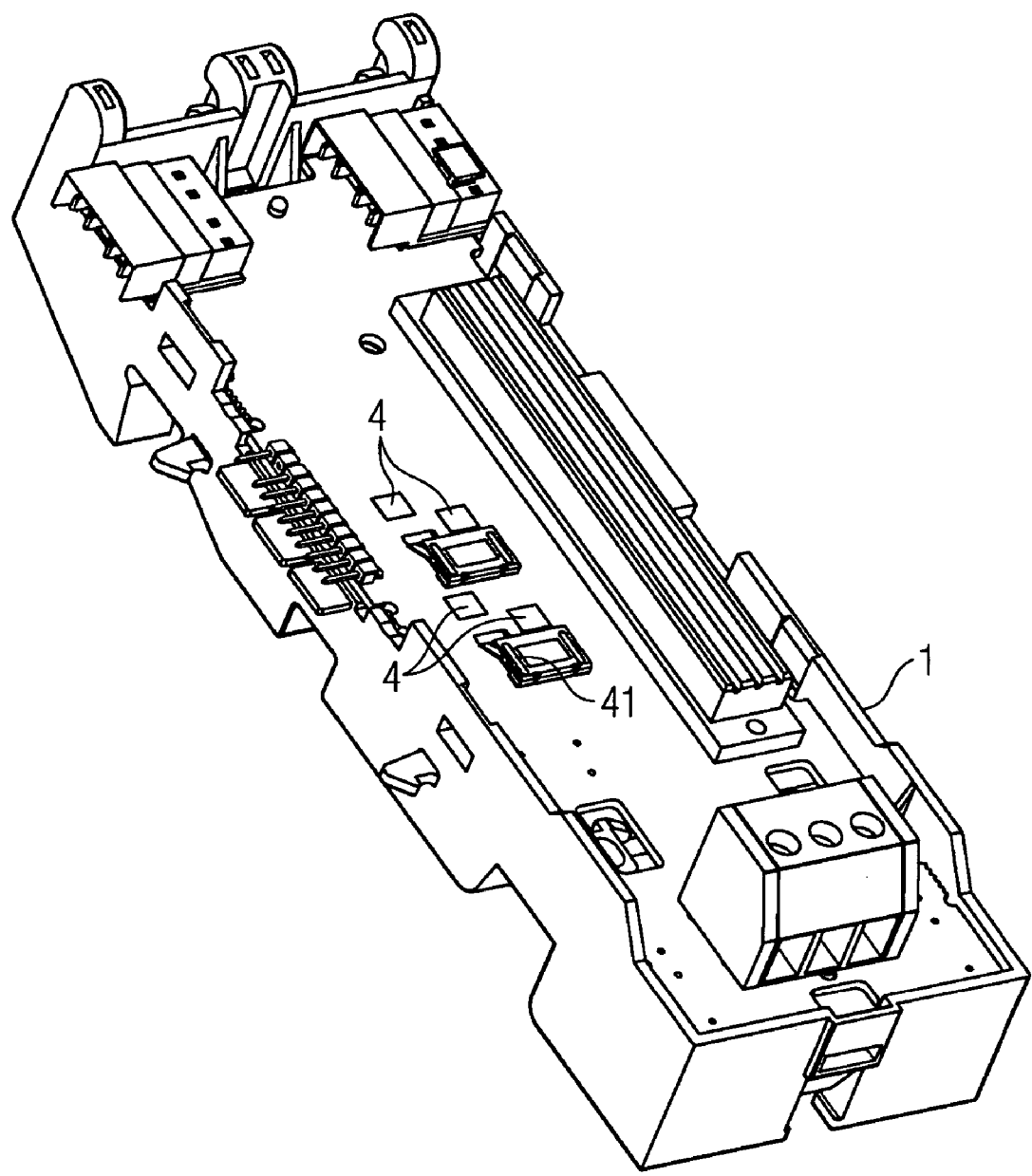
FIG. 5 shows a terminal module with opened contacts.

FIG 4 shows a terminal module 1 without catch 3 and without switching slide 32, having electrical contacts 4 in the closed state. The electrical contacts 4 are shown in the open state in FIG. 5.

FIG 6 shows a side view of a terminal module 1 having a sliding catch 3. The terminal module 1 is fixed on a mounting rail by means of fixing means 8 embodied as screws. Other forms of fixing means can also be used, such as cylindrical sockets, which when turned through a small angle (e.g. Y¼ turn) grip into a corresponding thrust piece; clips which fix the terminal module 1 on the mounting rail are also possible. The fixing means 8 are accessible to an operator via openings 9 present in the catch 3, where the openings are implemented at an angle to the vertical as shown in FIG. 7.

FIG 8 shows a side view of a fixed terminal module 1. In the figure, the screw 8 is already tightened firmly and hence the terminal module 1 is fixed firmly on the mounting rail. In this state the catch 3, which has a lip-like projection 31 at one end that can only be pushed over the screw 8 when the screw is fully tightened, can be moved.

If it is not possible to slide the catch over the screw 8, then the hinging-on process of a PS module 2 cannot take place because the hooked catches of the PS module 2 cannot be inserted in the openings 6 of the catch so as to be completely engaged. A hinging-on of a PS module 2 is thereby prevented on a terminal module 1 that is not completely fixed.

FIG 9 shows a plan view of the fixed terminal module 1 having catch 3. It is now possible to slide the catch 3 upward against the compression springs 5. Other forms of the thrust piece are also possible instead of the compression springs shown. In particular, different numbers of compression springs 5 can be used. In this fixed state, third openings 10 for operating a terminal 11 are accessible to the operator of the device.

Figure 10:
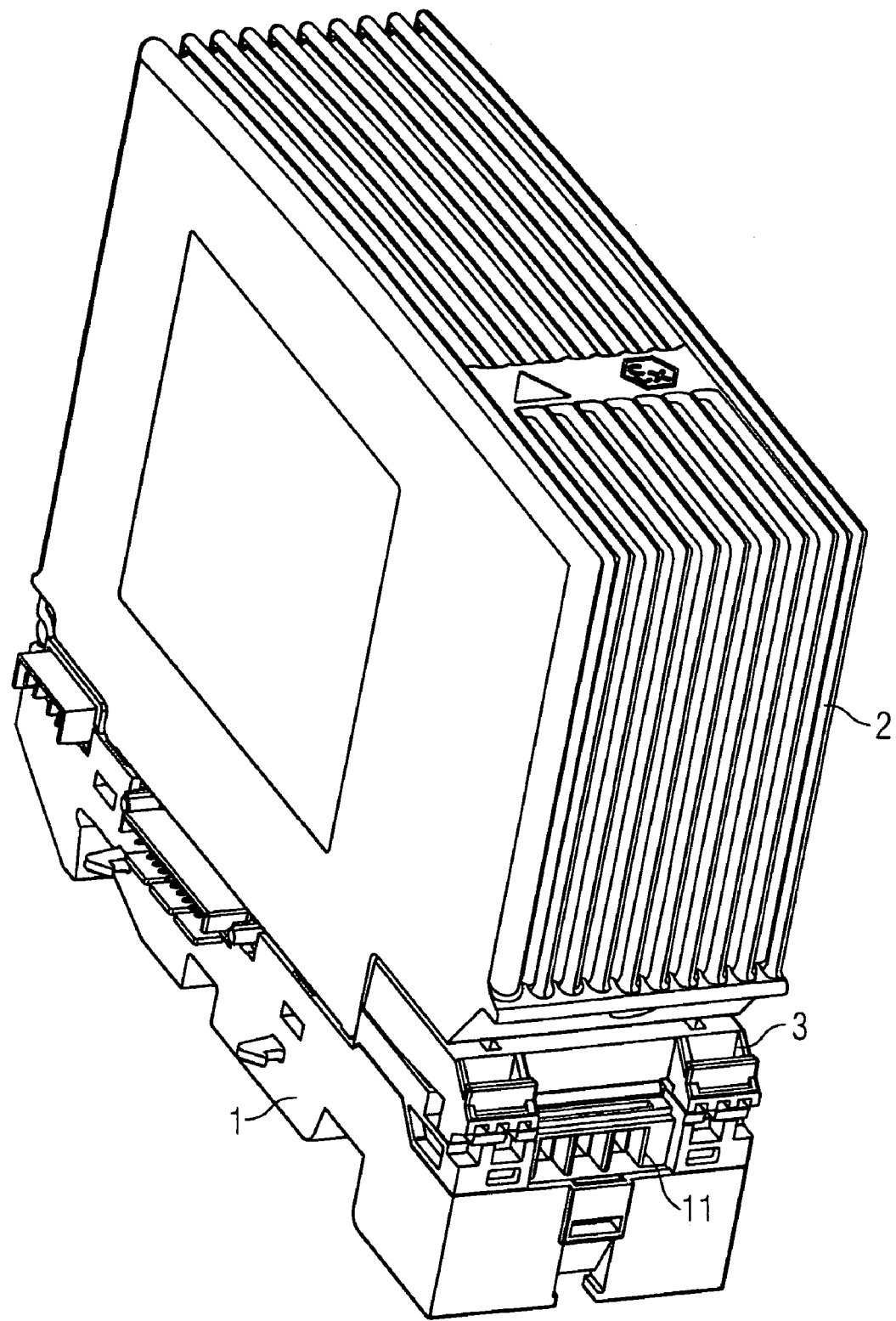
FIG. 10 shows terminal module with engaged subassembly.

FIG 10 shows a terminal module 1 having engaged PS module 2. The openings 10 for operating the terminal 11 and also the openings 9 for operating the fixing elements 8 are no longer accessible to the operator in this state.

Figure 11:
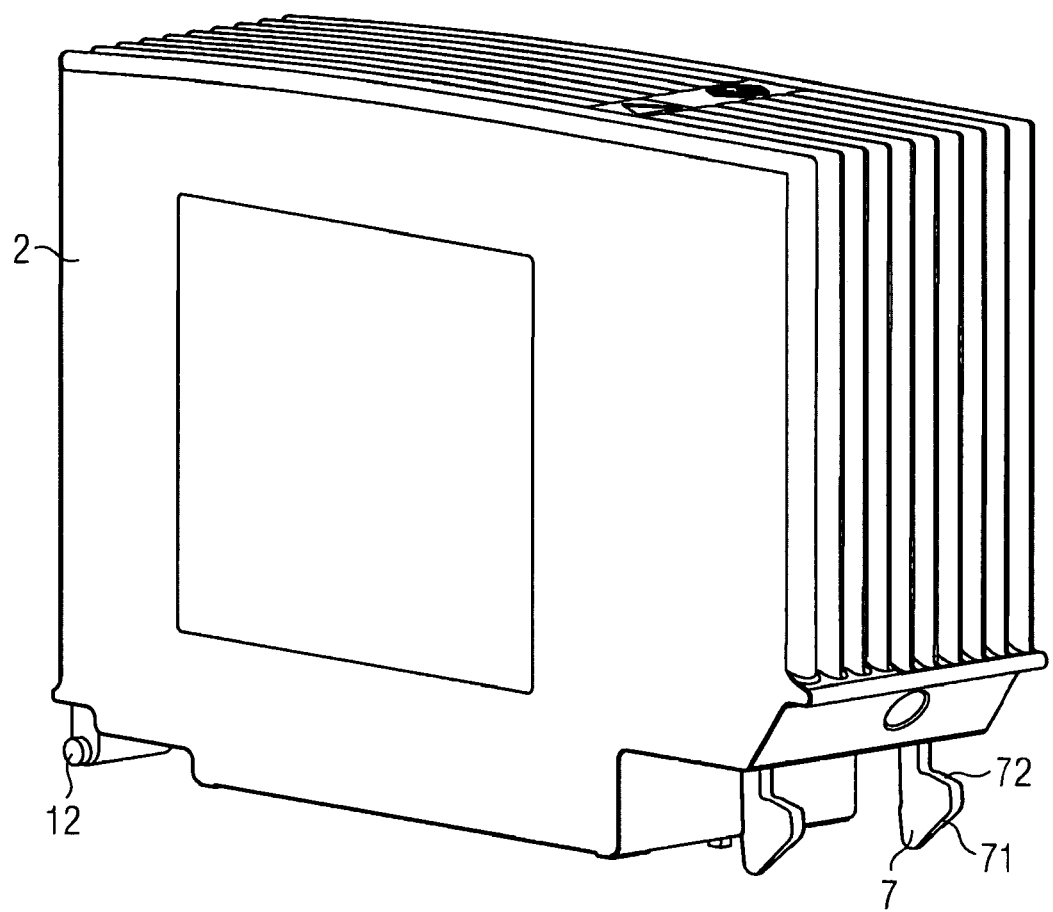
FIG. 11 shows subassembly having hooked catch.

FIG 11 shows a PS module 2 that has not been hinged on. The module 2 has one or more hooked catches 7, which is/are inserted into an opening 6 of the catch 3 on the terminal module 1. The hooked catches have a special shape which during the hinging-on onto a terminal module 1 causes a movement of the catch 3 on the terminal module 1 and once the hinging-on is complete results in a retention of the PS module 2 on the terminal module 1. During this process the first edge 71 of the hooked catch slides the catch 3 forward as the power supply 2 is hinged on. At the end of the hinging-on process the catch 3 slides over the second edge 72 of the hooked catch 7 and retains the PS module 2.

FIG. 12 shows the switching distance XS, the shape of the switching curve as a function of the hinging angle w of the PS module 2, and the engage angle wr. Switching distance, shape of the switching curve and engage angle depend on the geometrical shape of the hooked catch 7. They can therefore be adjusted to suit the contact behavior of the current carrying pins of the connector between PS module 2 and terminal module 1. In the engaged position xr, the PS module 2 is connected to the terminal module 1 with a positive fit and force fit via the catch 3. The necessary retention forces are produced using the fixing means or the compression spring 5, which ensures a defined position of the catch 3 during the hinging-on process. The compression spring 5 has no effect on the safety-related functions of the catch 3 and hence nor on those of the electrical contact.

The operating sequence as a function of the hinging angle w of the electronic module 2 during the plugging in is summarized below:

| Hinging angle | Operating sequence/action |
| --- | --- |
| w0 to w1 | The switch in the terminal module 1 is closed and the catch 3 is located in the engaged position xr. The switch comprises spring plates on the contact elements 4 and corresponding contact surfaces on the printed circuit board. |
| w1 to w2 | The catch 3 is moved against the force of the compression spring 5 in direction x along the curve described by the hooked catch or switching cam 7. The contact element 4 is mechanically connected to the catch 3 and hence also moves linearly in direction x, the switch being opened in the process. |
| w2 | The switch in the terminal module 1 is safely open. At this hinging angle, the creepage distances and clearances between the current carrying pins of the connector forming the electrical connection between terminal module 1 and PS module 2 are still large enough to prevent any arcing or sparking. |
| w2 to wr | The switch in the terminal module 1 remains open. All pin contacts of the connector are inserted. |
| wr | The catch 3 is moved by the force of the compression spring 5 in the opposite direction to direction x. Terminal module 1 and PS module 2 are connected via the catch 3 with a force fit and positive fit. The switch in the terminal module 1 is closed. The PS module is operational. |

The operating sequence described proceeds in the reverse order when pulling out the PS module 2. The catch 3 is pulled out of the engaged position xr into the switching position xs by means of a tool (e.g. screwdriver).

To summarize, the invention relates to a terminal module 1 for locking a subassembly or a PS module 2 on the terminal module in a way that satisfies safety requirements. The subassembly 2 is hinged onto the terminal module 1. The terminal module 1 has a sliding catch 3 for fixing the subassembly 2 on the terminal module 1. Disconnection of electrical contacts is guaranteed during the hinging-on.

The invention claimed is:

1. A terminal module for accommodating a subassembly, the terminal module comprising:
    a sliding latch for mechanical arresting of the subassembly in an operating state, wherein the latch is moveable linearly when pulling out and/or plugging in the subassembly; and
    electrical contacts for the subassembly, wherein the electrical contacts are connected to the latch in such a way that the electrical contacts are opened when pulling out and/or plugging in the subassembly,
    wherein a switching slide is provided for connecting the electrical contacts to the latch.

2. The terminal module as claimed in claim 1, wherein a thrust piece is provided, and wherein the latch can be moved against a force produced by the thrust piece.

3. The terminal module as claimed in claim 1, wherein the latch has a first opening for receiving a hooked catch of the subassembly.

4. The terminal module as claimed in claim 1, further comprising a fixing mechanism for fixing the terminal module on a mounting rail, the fixing mechanism is arranged in such a way that the latch can only be moved in the fixed state.

5. The terminal module as claimed in claim 1, wherein the latch has a third opening, the third opening only being accessible in the fixed state, when the latch can be moved.

6. The terminal module as claimed in claim 5, wherein in the operating state, the plugged-in subassembly is provided to cover the third opening.

7. The terminal module as claimed in claim 5, wherein the third opening is provided for operating an electrical terminal.

8. The terminal module as claimed in claim 7, wherein in the operating state, the plugged-in subassembly is provided to cover the third opening.

9. A terminal module for accommodating a subassembly, the terminal module comprising:
    a sliding latch for mechanical arresting of the subassembly in an operating state, wherein the latch is moveable linearly when pulling out and/or plugging in the subassembly;
    electrical contacts for the subassembly, wherein the electrical contacts are connected to the latch in such a way that the electrical contacts are opened when pulling out and/or plugging in the subassembly; and
    a fixing mechanism for fixing the terminal module on a mounting rail, the fixing mechanism is arranged in such a way that the latch can only be moved in the fixed state.

10. The terminal module as claimed in claim 9, wherein the latch has a second opening for operating the fixing mechanism.

11. The terminal module as claimed in claim 9, wherein screws are used as fixing mechanism.

12. The terminal module as claimed in claim 11, wherein the latch has a second opening for operating the fixing mechanism.

13. A terminal module for accommodating a subassembly, the terminal module comprising:
    a sliding latch for mechanical arresting of the sub assembly in an operating state, wherein the latch is moveable linearly when pulling out and/or plugging in the subassembly;

electrical contacts for the subassembly, wherein the electrical contacts are connected to the latch in such a way that the electrical contacts are opened when pulling out and/or plugging in the subassembly, a thrust piece, wherein the latch can be moved against a force produced by the thrust piece; and a fixing mechanism for fixing the terminal module on a mounting rail, the fixing mechanism is arranged in such a way that the latch can only be moved in the fixed state.

* * * * *